(12) United States Patent
Yakovlev et al.

(10) Patent No.: US 9,121,871 B2
(45) Date of Patent: Sep. 1, 2015

(54) APPARATUS AND METHOD FOR VOLTAGE SENSING

(75) Inventors: Alexandre Yakovlev, Newcastle upon Tyne (GB); Reza Ramezani, Newcastle upon Tyne (GB); Terrence Mak, Newcastle upon Tyne (GB)

(73) Assignee: University of Newcastle Upon Tyne, Tyne & Wear (GB)

( * ) Notice: Subject to any disclaimer, the term of this patent is extended or adjusted under 35 U.S.C. 154(b) by 467 days.

(21) Appl. No.: 13/638,330

(22) PCT Filed: Feb. 28, 2011

(86) PCT No.: PCT/GB2011/050390
§ 371 (c)(1),
(2), (4) Date: Dec. 13, 2012

(87) PCT Pub. No.: WO2011/121323
PCT Pub. Date: Oct. 6, 2011

(65) Prior Publication Data
US 2013/0200727 A1    Aug. 8, 2013

(30) Foreign Application Priority Data
Mar. 30, 2010    (GB) .................................. 1005372.6

(51) Int. Cl.
*G05F 5/00* (2006.01)
*G01R 19/00* (2006.01)
*H03M 1/60* (2006.01)
*H01M 10/48* (2006.01)
*G01R 31/36* (2006.01)

(52) U.S. Cl.
CPC ............. *G01R 19/0084* (2013.01); *H03M 1/60* (2013.01); *G01R 31/36* (2013.01); *H01M 10/48* (2013.01)

(58) Field of Classification Search
USPC ........................................................ 307/151
See application file for complete search history.

(56) References Cited

U.S. PATENT DOCUMENTS

| | | | |
|---|---|---|---|
| 3,480,858 A | * | 11/1969 | Holt et al. ..................... 324/678 |
| 3,790,886 A | | 2/1974 | Kurtin et al. |
| 3,828,255 A | | 8/1974 | Schuon |
| 4,058,808 A | | 11/1977 | Malaviya |
| 4,071,822 A | | 1/1978 | Kamiya |

(Continued)

FOREIGN PATENT DOCUMENTS

| | | |
|---|---|---|
| DE | 2743448 | 3/1979 |
| GB | 1500830 | 2/1978 |

(Continued)

OTHER PUBLICATIONS

International Search Report as mailed on May 10, 2011 for International Application No. PCT/GB2011/050390.

(Continued)

*Primary Examiner* — Ronald W Leja
(74) *Attorney, Agent, or Firm* — Quarles & Brady LLP

(57) ABSTRACT

A voltage measuring apparatus for use in an energy harvesting system is disclosed. The apparatus includes a capacitor (6) adapted to be charged by means of a voltage to be measured, and an asynchronous digital counter (12) having power supply terminals adapted to be selectively connected to the capacitor during discharge of the capacitor and to provide a digital output signal dependent upon the voltage level of the capacitor the start of discharging of the capacitor.

9 Claims, 4 Drawing Sheets

(56) References Cited

U.S. PATENT DOCUMENTS

| | | | |
|---|---|---|---|
| 4,866,389 A * | 9/1989 | Ryan et al. | 324/433 |
| 6,445,162 B1 * | 9/2002 | Mukainakano | 320/132 |
| 2006/0049972 A1 | 3/2006 | Augusto et al. | |
| 2007/0096836 A1 | 5/2007 | Lee et al. | |
| 2013/0200727 A1 * | 8/2013 | Yakovlev et al. | 307/126 |

FOREIGN PATENT DOCUMENTS

| JP | 58021104 | 2/1983 |
|---|---|---|
| JP | 2001204141 | 7/2001 |

OTHER PUBLICATIONS

Yat-Fong Yung, et al., 'A Digital CMOS Imager with Pixel Level Analog-to-Digital Converter and Reconfigurable SRAM/Counter.' System-on-Chip for Real-Time Applicantions, 2004, Proceedings of the 4th IEEE International Workshop, pp. 33-36.

International Preliminary Report on Patentability as mailed on Apr. 5, 2012 for International Application No. PCT/GB2011/050390.

Search Report for British Patent Application No. GB1005372.6.

* cited by examiner

APPARATUS AND METHOD FOR VOLTAGE SENSING

CROSS-REFERENCE TO RELATED APPLICATIONS

This application represents the national stage entry of PCT International Application No. PCT/GB2011/050390 filed Feb. 28, 2011 and claims the benefit of British Patent Application No. GB 1005372.6 filed Mar. 30, 2010. The contents of both of these applications are hereby incorporated by reference for all purposes as if set forth in their entirety herein.

The present invention relates to an apparatus and method for voltage sensing, and relates particularly, but not exclusively, to an apparatus and method for power sensing in energy harvesting systems.

Energy supply is of great importance in designing battery powered circuits, because the lifetime and utility of systems are limited by how long the batteries are able to sustain operation. Energy harvesting systems, in which energy is harvested from the environment around a device, become a promising alternative to battery supplies to increase system lifetime and reduce the maintenance cost of periodic battery replacement. However, because of the varying nature of the energy supplied from the environment compared with a battery source, different power management methods are required for energy harvesting systems than for battery powered systems. In addition, adaptive power management schemes need to be developed to adapt to the dynamics of energy consumers and of the energy supply of the system.

In order to enable run-time power management of energy harvesting systems, it is important to be able to carry out low overhead power sensing. A power sensor provides a measure of the existing energy reservoir, and can be used to enable the system to adapt to the energy supply. However, the operation of conventional power sensing apparatus becomes difficult, since many components, such as analogue to digital convertors used to enable digital control of the system, work under the assumption of a constant and stable power supply, which assumes unlimited current supply with a constant supply voltage. This assumption is no longer valid in energy harvesting systems, since the supply voltage drops while the system power dissipates, and may rise when new energy is harvested. As a result, known power sensing apparatus requires a separate stable power supply in order to ensure its correct operation. This increases the equipment and maintenance cost of the apparatus.

Preferred embodiments of the present invention seek to overcome one or more of the above disadvantages of the prior art.

According to an aspect of the present invention, there is provided a voltage measuring apparatus comprising:

capacitor means adapted to be charged by means of a voltage to be measured; and digital counter means having power supply terminals adapted to be selectively connected to said capacitor means during discharge thereof and to provide a digital output signal dependent upon the voltage level of said capacitor means at the start of said discharging of said capacitor means.

By providing digital counter means having power supply terminals adapted to be selectively connected to the capacitor means during discharge thereof and to provide a digital output signal dependent upon the voltage level of the capacitor means at the start of said discharging, this provides the advantage that a separate stable power supply for powering the voltage measuring apparatus is no longer required, since the voltage measuring apparatus can be powered by the voltage source being measured. This in turn provides the advantage of reducing the equipment and maintenance cost of the apparatus.

The counter means may comprise at least one toggle circuit adapted to produce output pulses when sufficient voltage is applied to power supply terminals thereof.

This provides the advantage of enabling efficient digital processing of the output signal of the voltage measuring apparatus, by supplying a digital signal directly to a digital processor, because the voltage on the capacitor means at the start of discharging thereof will be dependent on the number of pulses generated by the toggle circuit. For example, in order to control operation of an energy harvesting system incorporating the apparatus, the power of the energy harvesting system can be determined from a rapid measurement of the voltage on the capacitor means at the start of discharging, which can be input directly from the toggle circuit to a digital processor to provide a control signal for controlling the energy harvesting system.

The counter means may comprise a plurality of said toggle circuits interconnected to provide a multi-bit output signal.

This provides the advantage of enabling rapid and efficient processing of the output signal of the digital counter means.

A said toggle circuit of one stage of said counter means may be adapted to produce output pulses of twice the frequency of a said toggle circuit of a following stage of said counter means.

This provides the advantage of enabling a binary multi-bit counter to be efficiently provided.

The counter means may comprise at least one ring oscillator.

The counter means may be adapted to use thermometer coding.

According to another aspect of the present invention, there is provided an apparatus for controlling the power of an energy harvesting system, the apparatus comprising:— a voltage measuring apparatus as defined above for sensing a power level of said system; and control means for receiving an output signal from said digital counter means and for generating a control signal for controlling operation of said energy harvesting system.

According to a further aspect of the present invention, there is provided a voltage measuring method comprising:

causing a voltage to be measured to charge capacitor means; and selectively connecting said capacitor means to power supply terminals of digital counter means adapted to provide a digital output signal dependent upon the voltage level of said capacitor means at the start of said discharging of said capacitor means.

The counter means may be adapted to provide a multi-bit output signal.

A preferred embodiment of the invention will now be described, by way of example only, and not in any limitative sense, with reference to the accompanying drawings in which.

Figure 1:
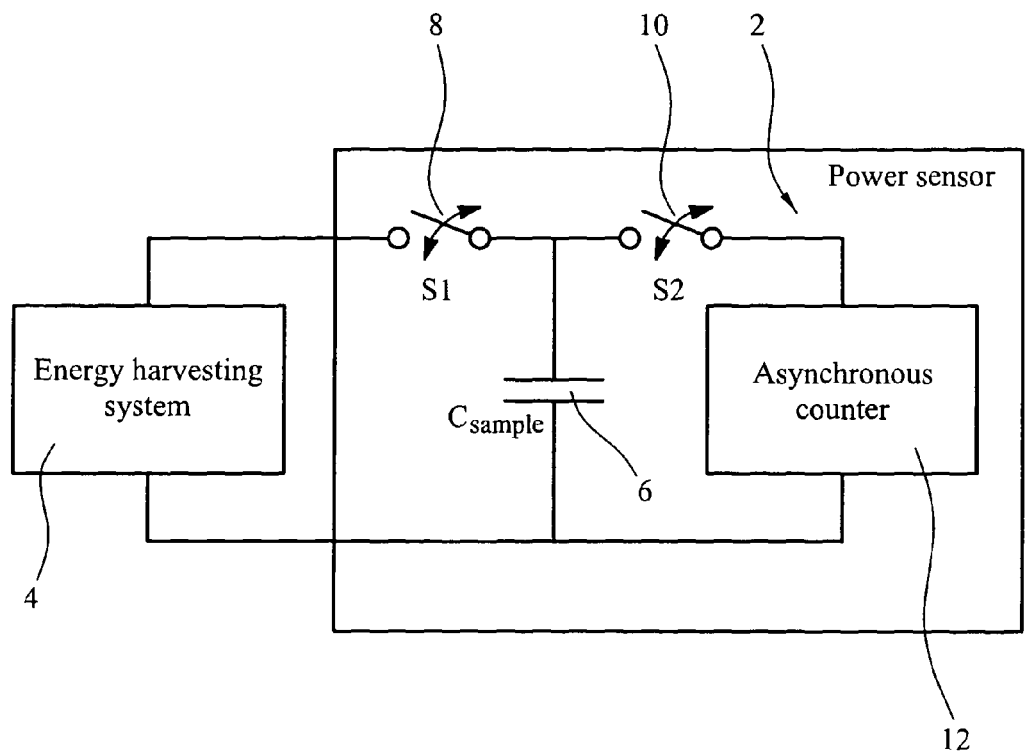
FIG. 1 is a schematic representation of a power sensing apparatus embodying the present invention for use with an energy harvesting system.

Referring to FIG. 1, a power sensing apparatus 2 for sensing the run-time power of an energy harvesting system 4 comprises a sampling capacitor 6 selectively connectable via a switch 8 to the energy harvesting system 4 and via a switch 10 to the power supply terminals of an asynchronous digital counter 12. The power sensing apparatus 2 has two states, i.e. a first state in which the switch 8 is on and switch 10 is off such that the sampling capacitor 6 is charged to a voltage Vin-Vs1 where Vs1 is the voltage drop across the switch 8, and a second state in which switch 8 is off and switch 10 is on so that the sampling capacitor 6 discharges through the power supply terminals of the counter 12. In the second state, the supply voltage to the counter 12 is Vin-Vs1-Vs2, where Vs2 is the voltage drop across the switch 10.

The capacitor 6 discharges exponentially through the counter 12 and the counter begins counting (i.e. producing an output signal representing a number of pulses generated by the counter 12) as soon as the voltage applied to its power supply terminals is high enough to operate its transistors. When the supply voltage of the counter 12 approaches zero, the amplitude of the counter signals also approaches zero and the switching activity by the transistors of the counter 12 ceases.

Figure 2:
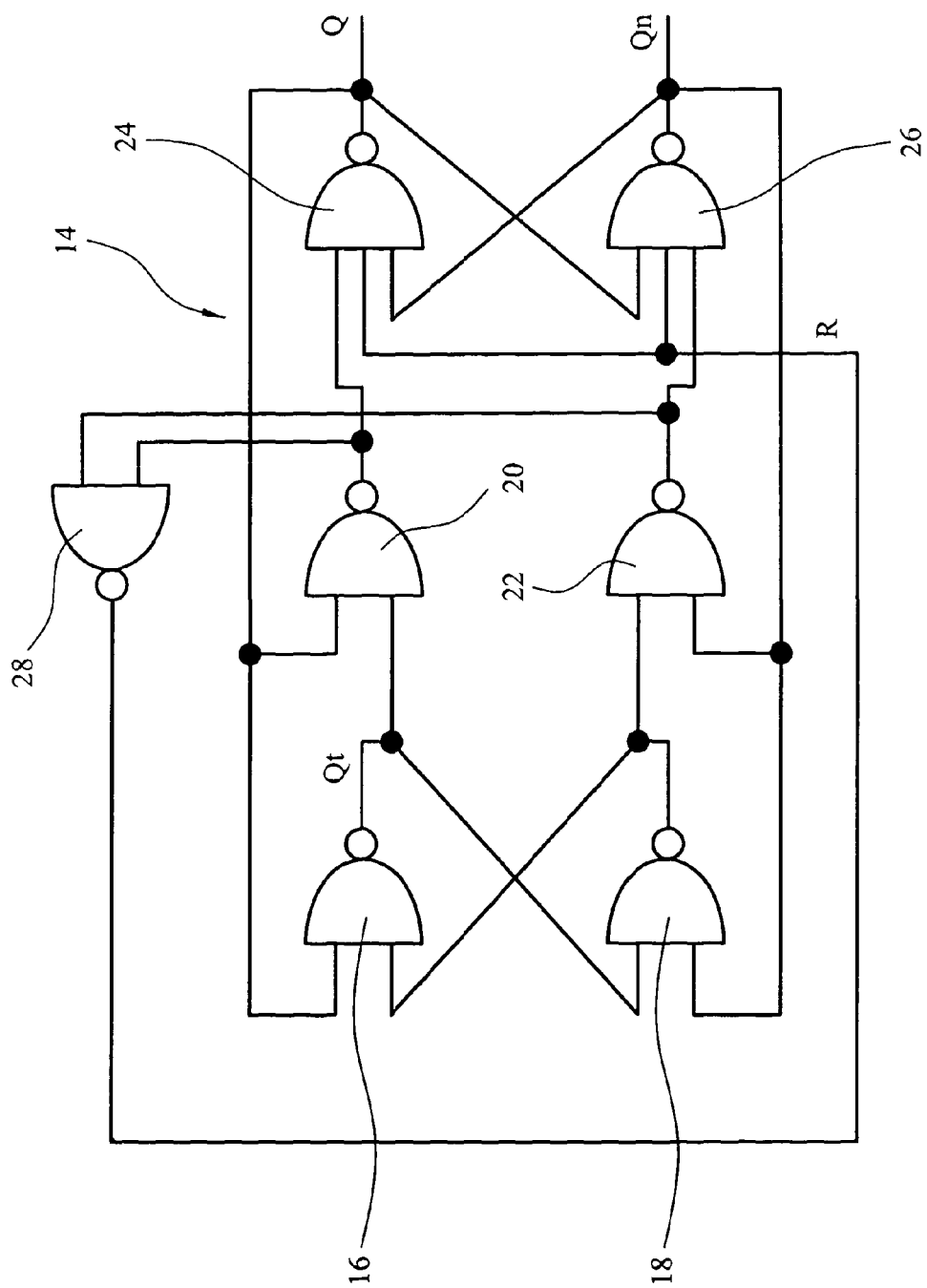
FIG. 2 is a circuit diagram of an asynchronous toggle circuit of the apparatus of FIG. 1.

Referring to FIG. 2, the asynchronous counter 12 includes a toggle circuit 14 comprising a first flip flop consisting of a pair of NAND gates 16, 18, wherein one of the NAND gates 16 provides an output signal Qt representing a number of pulses generated by the toggle circuit 14 since a sufficiently high supply voltage is applied to its power supply terminals (not shown). The outputs of NAND gates 16, 18 are connected via respective NAND gates 20, 22 to respective NAND gates 24, 26 of a second flip flop which provides output signals Q and Qn respectively. The output of NAND gate 24 is connected to the inputs of NAND gates 16 and 20, and the output of NAND gate 26 is connected to the inputs of NAND gates 18 and 22. The outputs of NAND gates 20 and 22 are connected to NAND gate 28, which supplies a reset signal R to the inputs of NAND gates 24 and 26.

Figure 3:
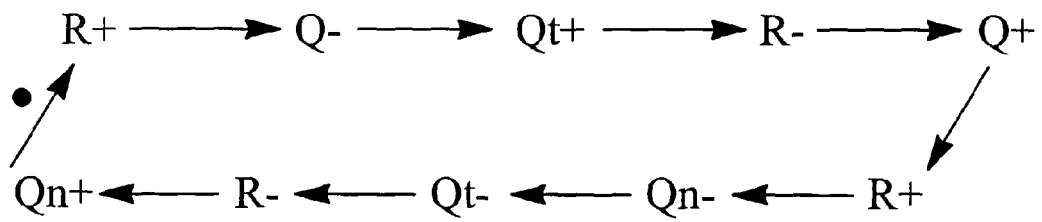
FIG. 3 is a signal transition graph describing operation of the toggle circuit of FIG. 2.

The operation of the toggle circuit 14 shown in FIG. 2 will now be described with reference to FIGS. 2 and 3.

Taking the initial state of the toggle circuit of FIG. 2 as Qt=0, R=0, Q=1 and Qn=1, the output of NAND gate 22 is forced by the output of NAND gate 26 to 0, as a result of which the output of NAND gate 28 changes to 1 to change the reset signal R to 1. As a result, all of the inputs to NAND gate 24 are 1, which changes output Q of NAND gate 24 to 0. This in turn forces the outputs of NAND gates 16 and 20 to 1, as a result of which the output signal Qt of NAND gate 16 changes to 1. This in turn changes the output of NAND gate 18 to 0 and the output of NAND gate 22 to 1 so that both of the inputs to NAND gate 28 are now 1. The output of NAND gate 28 therefore goes to zero and the reset signal R becomes 0. As result, the output of NAND gate 24 (i.e. the output Q) becomes 1. This in turn causes the output of NAND gate 20 to become 0 and the output of NAND gate 28 (i.e. reset signal R) therefore becomes 1. As a result of this transition, all three inputs to NAND gate 26 are 1, and its output Qn therefore becomes 0. This in turn forces the outputs of NAND gates 18 and 22 to 1, and since both inputs to NAND gate 16 are 1, output signal Qt therefore changes to 0. This in turn drives the output of NAND gate 20 to 1, which makes the output of NAND gate 28 zero so that the reset signal R becomes 0. This in turn drives the output of NAND gate 26 to 1 to bring the toggle circuit to its initial state, after which the entire process described above repeats itself as long as a sufficiently high voltage is applied to the voltage supply terminals to drive the transistors of the NAND gates of the circuit 14. It can therefore be seen that during the entire cycle, the output signal Qt goes from 0 to 1 and back to zero, while the reset signal R goes from 0 to 1 and back to 0 twice.

Figure 4:
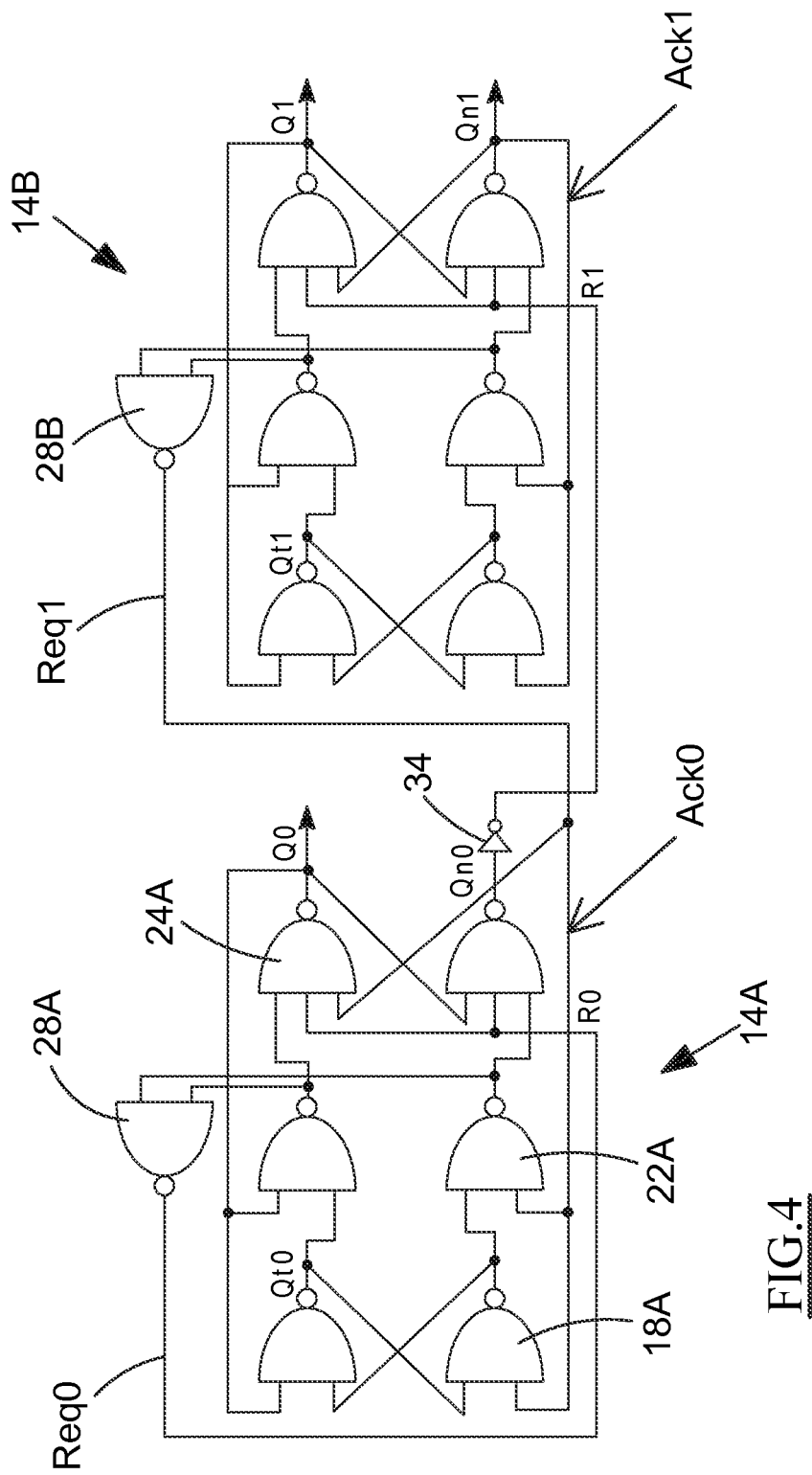
FIG. 4 is a two-bit counter including two toggle circuits of FIG. 2.

Referring to FIG. 4, a two-bit counter 32 comprises a pair of counters 14A, 14B, each of which is as disclosed in FIG. 2 but instead of connecting the output of NAND gate 28 directly to the inputs of NAND gates 24, 26 as a reset signal as in FIG. 2, the reset signal R1 for counter 14B is provided from output Qn0 of counter 14A via an inverter 34, and the output of NAND gate 28B of toggle circuit 14B is connected to the inputs of NAND gates 18A, 22A and 24A.

The operation of the two-bit counter 32 shown in FIG. 4 will now be described.

As a result of the reset signal R1 for the second toggle circuit 14B of the counter being reset to 1 via inverter 34 when output Qn0 of the first toggle circuit 14A goes to 0, and the output of NAND gate 28B of toggle circuit 14B replacing the feedback effect of output Qn0 in toggle circuit 14A, it can be seen that during one complete cycle of operation of the toggle circuit 14A, the reset signal R1 goes from 0 to 1 and back to 0, whereas the reset signal R0 makes the transition from 0 to 1 and back to 0 twice. Accordingly, in order to ensure the complete cycle of operation of the toggle circuit 14B, i.e. in which the output signal Qt1 goes from 0 to 1 and back to 0, two cycles of operation of the toggle circuit 14A are necessary, i.e. the output Qt1 of the counter 32 toggles at half the frequency of the output Qt0. The counter 32 therefore outputs a two-bit binary word at outputs Qt0, Qt1 representing the number of pulses produced by toggle circuit 14A, which in turn is dependent upon the initial level of voltage in the capacitor 6 of FIG. 1.

Figure 5:
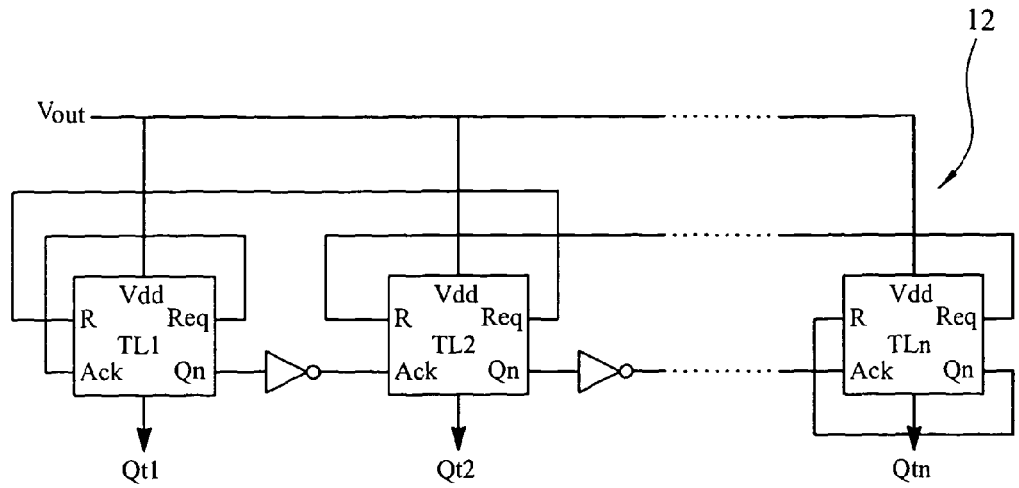
FIG. 5 is an n-bit asynchronous counter based on the counter of FIG. 4.

The arrangement of FIG. 4 can be extended by cascading further toggle circuits 14 in a similar manner to produce an n+1-bit asynchronous counter 12 as shown in FIG. 5, (i.e. the counter 12 of FIG. 1) in which the n+1-bit digital word is taken from the outputs Qt1, Qt2 to Qtn. This provides a digital output signal which can be efficiently processed by a digital controller to control operation of the energy harvesting system 4.

Figure 6:
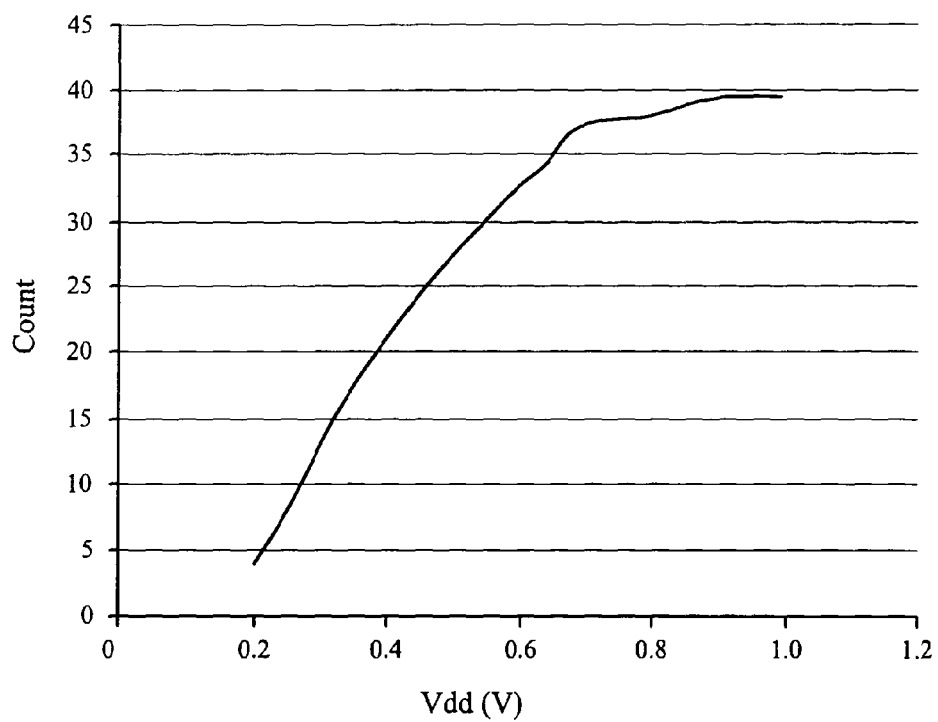
FIG. 6 is a graph showing the dependence of the output of the counter of FIG. 5 on supply voltage.

Referring to FIG. 6, it can seen that the counter 12 of FIG. 5 acts as an analogue to digital converter providing a digital output dependent upon the voltage stored on sampling capacitor 6. FIG. 6 shows the results of the output of the counter of FIG. 5 for different values of the input voltage Vdd=Vout. It can be seen that the counter begins to work at about Vdd=0.2 volts and the digital counts are approximately linearly proportional to the input voltage from 0.2 volts to 0.7 volts. At input voltages higher than 0.7 volts, the curve flattens and converges to a count of 40, and the linear region of the curve provides a reasonable resolution of analogue to digital conversion. In this way, a low overhead power sensor is provided for the energy harvesting system which does not require a separate stable power supply.

It will be appreciated by persons skilled in the art that the above embodiment has been described by way of example only, and not in any limitative sense, and that various alterations and modifications are possible without departure from the scope of the invention as defined by the appended claims. For example, instead of using flip flops, a digital counter can be provided which is based on ring oscillators. The counter 12 may comprise different configurations of logic whose power supply comes from the capacitor 6. These configurations can produce different forms of digital information encoding. In the case of the toggle circuit 14 of FIG. 2, the encoding is binary, where each bit of higher significance has the weight that is double of that of the lower significance bit, immediately before it. Less dense digital encoding can be used, for example a one hot code, such as 10000, 01000, 00100 . . . in which logical one will propagate through a set of latches, or the so called thermometer code 00000, 10000, 11000, 11100, . . . can be used, where a chain of buffers (e.g. built as pairs of inverters) propagates a wave of logical ones. Depending on the code used, and hence its information density (i.e. number of digital values per wire), the sensor can have different amounts of energy required for changing the state of the counter. For example, the binary counter based on the toggles would require more energy per single count event than the thermometer code configuration based on the chain of buffers. This energy can be measured in terms of the number of transitions of a gate as a rough estimate. In that case the toggle circuit based counter requires 18 transitions per count compared to only 2 transitions in the chain of buffers. This measure can help guide several design options and tradeoffs including the accuracy, delay of measurement and amount of energy consumption per sample of voltage, which will ultimately determine the value of the sampling capacitor and the time of its charge during the sample.

What is claimed is:

1. A voltage measuring apparatus comprising:
at least one capacitor adapted to be charged by means of a voltage to be measured; and
at least one digital counter device;
characterized in that at least one said digital counter device has power supply terminals adapted to be selectively connected to at least one said capacitor during discharge thereof and to provide a digital output signal dependent upon the voltage level of said capacitor at the start of said discharging of said capacitor.

2. An apparatus according to claim 1, wherein at least one said counter device comprises at least one toggle circuit adapted to produce output pulses when sufficient voltage is applied to power supply terminals thereof.

3. An apparatus according to claim 2, wherein at least one said counter device comprises a plurality of said toggle circuits interconnected to provide a multi-bit output signal.

4. An apparatus according to claim 3, wherein a said toggle circuit of one stage of at least one said counter device is adapted to produce output pulses of twice the frequency of a said toggle circuit of a following stage of said counter device.

5. An apparatus according to claim 1, wherein at least one said counter device comprises at least one ring oscillator.

6. An apparatus according to claim 1, wherein at least one said counter device is adapted to use thermometer coding.

7. An apparatus for controlling the power of an energy harvesting system, the apparatus comprising:—
a voltage measuring apparatus according to claim 1 for sensing a power level of said system; and
at least one control device for receiving an output signal from at least one said digital counter device and for generating a control signal for controlling operation of said energy harvesting system.

8. A voltage measuring method comprising:—
causing a voltage to be measured to charge at least one capacitor;
characterized by selectively connecting at least one said capacitor to power supply terminals of at least one digital counter device adapted to provide a digital output signal dependent upon the voltage level of said capacitor at the start of said discharging of said capacitor.

9. A method according to claim 8, wherein at least one said counter device is adapted to provide a multi-bit output signal.

* * * * *